United States Patent [19]

Chen

[11] Patent Number: 4,996,167
[45] Date of Patent: Feb. 26, 1991

[54] METHOD OF MAKING ELECTRICAL CONTACTS TO GATE STRUCTURES IN INTEGRATED CIRCUITS

[75] Inventor: Min-Liang Chen, Allentown, Pa.

[73] Assignee: AT&T Bell Laboratories, Murray Hill, N.J.

[21] Appl. No.: 546,131

[22] Filed: Jun. 29, 1990

[51] Int. Cl.$^5$ ............................................. H01L 21/70
[52] U.S. Cl. ...................................... 437/40; 437/978; 437/56; 437/42; 437/911; 148/43; 156/653
[58] Field of Search ............... 437/978, 42, 911, 40, 437/920, 56, 57, 58; 148/43; 156/653

[56] References Cited

U.S. PATENT DOCUMENTS

| | | | |
|---|---|---|---|
| 3,673,679 | 7/1972 | Carbajal, III et al. | 148/43 |
| 3,921,283 | 11/1975 | Shappir | 437/978 |
| 3,943,621 | 3/1976 | Hartman | 437/978 |
| 4,571,816 | 2/1986 | Dingwall | 156/653 |
| 4,782,037 | 11/1988 | Tomozawa et al. | 437/56 |
| 4,808,552 | 2/1989 | Anderson | 148/43 |

FOREIGN PATENT DOCUMENTS 0207932  8/1989  Japan .................. 437/978

Primary Examiner—Brian E. Hearn
Assistant Examiner—Michael Trinh
Attorney, Agent, or Firm—R. D. Laumann

[57] ABSTRACT

Contacts to the gate electrode of a first field-effect transistor and the source/drain region of a second field-effect transistor are formed using a silicide as a local interconnect.

9 Claims, 2 Drawing Sheets

METHOD OF MAKING ELECTRICAL CONTACTS TO GATE STRUCTURES IN INTEGRATED CIRCUITS

TECHNICAL FIELD

This invention relates generally to the field of integrated circuit manufacturing and specifically to a method of forming electrical contacts to, for example, the gate electrodes of devices in the integrated circuit.

BACKGROUND OF THE INVENTION

As integrated circuits increase in size and complexity, techniques which reduce the space needed for an individual circuit without adding undue processing complexity continue to be important. In devising appropriate processing sequences, attention must be given, not only to the fabrication of the individual devices in the circuit, but also to how the devices will be electrically contacted and connected to each other. The considerations associated with electrical contacts and interconnections are important for all integrated circuits, including static random access memories which are commonly referred to by the acronym SRAM.

Such memories typically use a memory cell with either six field-effect transistors or with four such transistors and two load resistors. Two of the transistors are connected to form a flip-flop; i.e., the gate and source/drain region of the first transistor are connected to the source/drain region and gate, respectively, of the second transistor. This connection is typically fabricated from polysilicon. Although polysilicon is electrically conductive, better attributes, such as lower contact resistance, could be expected if a silicide could be used. Each cell stores one bit of information in a single word and is accessed through word and bit lines.

In many prior art circuits, the gate contact to an individual transistor is made over the field oxide to a gate runner which extends from the active device regions onto the field oxide. This type of contact is also used in types of integrated circuits other than SRAMs. Although this contact results in a less economical use of space than if the gate were contacted directly over the active device regions, it is widely used because of difficulties encountered in electrically contacting the gate over the active device region without inadvertently and disastrously contacting the active device regions located on opposite sides of the gate structure. These difficulties become greater as device dimensions decrease, i.e., as feature dimensions become smaller and the tolerances for registration errors decrease. Of course, even if the gate structure is contacted over the field oxide, a small window exposing the gate structure is desirable because it minimizes any problems that might arise from window misalignment with respect to the gate and source/drain regions.

SUMMARY OF THE INVENTION

A method of integrated circuit manufacture comprising the steps of making a plurality of field-effect transistors, each comprising source and drain regions and a gate structure, and being disposed on a common substrate, and making an electrical contact to at least said gate structure of at least one of said field-effect transistors, said step of making an electrical contact comprising the further steps of forming first, second, third, and fourth insulating layers having first, second, third, and fourth compositions, respectively, over said plurality of said field-effect transistors, adjacent layers having different etching characteristics; patterning a resist over said fourth layer to expose selected portions of said fourth layer, at least one of said portions being generally over at least said gate structure of a first transistor; etching said exposed portion of said fourth and third layers to form windows which expose portions of said second layer; forming sidewalls on said windows; etching said exposed portions of said second and first layers using said sidewalls and said second layer, respectively, as etch masks to expose at least said gate structure; and forming a patterned conductor region contacting at least gate structure of said first transistor.

In one embodiment, the conductor comprises polysilicon. In a preferred embodiment, the polysilicon is silicided. In another preferred embodiment, the polysilicon electrically connects the source/drain region of a first transistor to the gate structure of a second transistor.

For reasons of clarity, the elements depicted are not drawn to scale and some elements, well known to those skilled in the art, are omitted.

DETAILED DESCRIPTION

Figure 1:
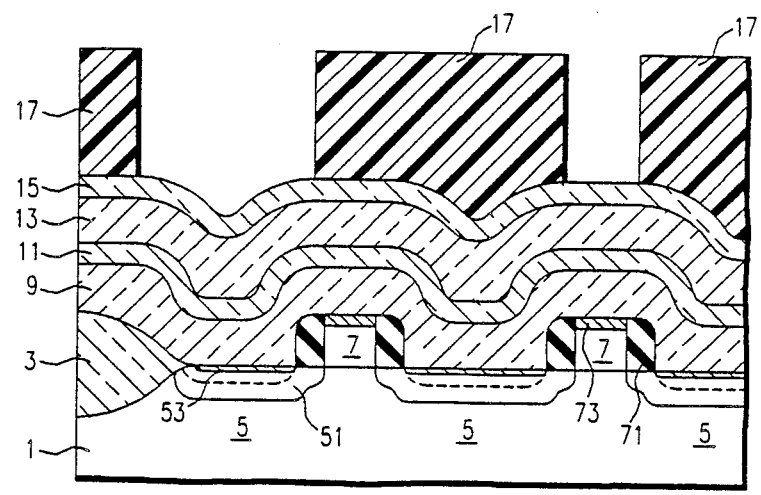
FIGS. 1-6 are sectional views illustrating steps in one processing sequence according to this invention which are used to form a gate contact to a transistor in an integrated circuit and to interconnect two transistors in the integrated circuit.

A sectional view of a portion of an integrated circuit is shown in FIG. 1 at an intermediate step in a fabrication sequence according to this invention. The integrated circuit has a plurality of field-effect transistors which have source and drain regions and a gate structure. Depicted are substrate 1, field oxide 3, source/drain regions 5, gate structures 7, first insulating layer 9, second insulating layer 11, third insulating layer 13, fourth insulating layer 15, and patterned resist layer 17. The gate structures belong to different field-effect transistors which are disposed on a common substrate. The source/drain regions further have lightly doped and silicide regions 51 and 53, respectively. The gate structures further comprise sidewalls 71 and silicide region 73.

The structure depicted is formed with techniques that are well known to those skilled in the art. Some comments will, however, lead to a better understanding of the invention. The substrate is typically single crystal silicon which may include an epitaxial layer. The source/drain regions are conventional and typically include the lightly doped regions as well as the silicided portions depicted. The top of the gate structure typically comprises a conductive material such as the silicide depicted. Adjacent insulating layers should have etching selectivity with respect to each other; i.e., there should be an etchant which will attack the exposed layer furthest from the substrate, but not the underlying layer. The insulating layers typically comprise deposited silicon oxides and nitrides. The oxides may have small amounts of dopants, such as boron or phosphorus, present. Such dopants may, for example, increase etching selectivity. For example, layers 9 and 13 may be oxides and layers 11 and 15 may be nitrides. Oxide layers 9 and 13 may comprise, e.g., TEOS and BPTEOS, respectively, although other deposited oxides may be used. TEOS is obtained from the decomposition of tetraethylorthosilane, and BPTEOS is similarly obtained but also comprises B and P. BPTEOS is desirable for the top layer because it can be removed by a wet etch with a selectivity, with respect to the undoped oxides, of about 50:1. The oxide layers will typically have thicknesses between 0.1 and 0.5 microns and the nitride layers will typically be less than 0.05 microns thick. The resist layer is typically an organic photoresist which has been patterned to expose selected portions of the top nitride, i.e., fourth layer which are generally over those portions of the devices which will be electrically contacted. For example, windows may be over the gate structure of a first transistor and the source/drain region of a second transistor. The window for the gate contact may be over either active device region or field oxide.

Figure 2:
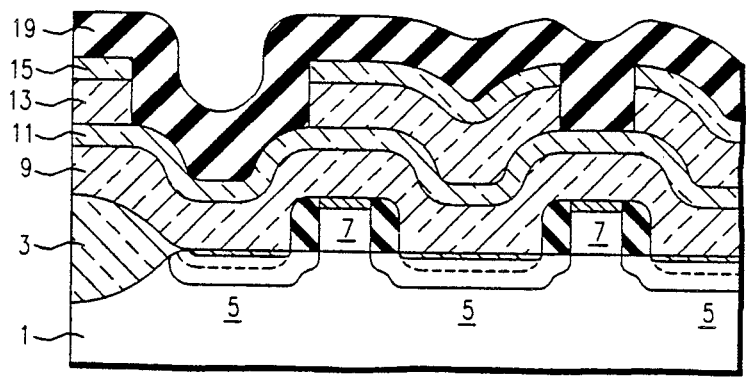

Standard etching techniques are used to remove the exposed portions of layer 15, e.g., the second nitride layer. Standard etching techniques are then used to remove the now exposed portions of layer 13, e.g., the second oxide layer; that is, the exposed portions of the fourth and third layers are etched to expose portions of the second layer. The photoresist layer is removed using conventional techniques. A fifth insulating layer 19, typically comprising an oxide such as BPTEOS, is now deposited with a thickness of approximately 0.3 microns. The thickness should be sufficient so that sidewalls covering the edge of nitride layer 15 remain after an etchback. The resulting structure is depicted in FIG. 2.

Figure 3:
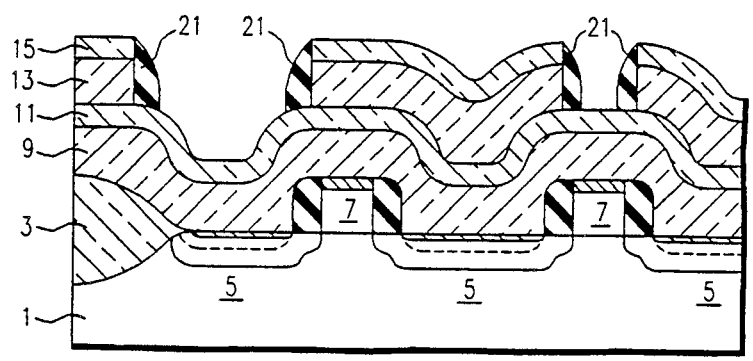
Figure 4:
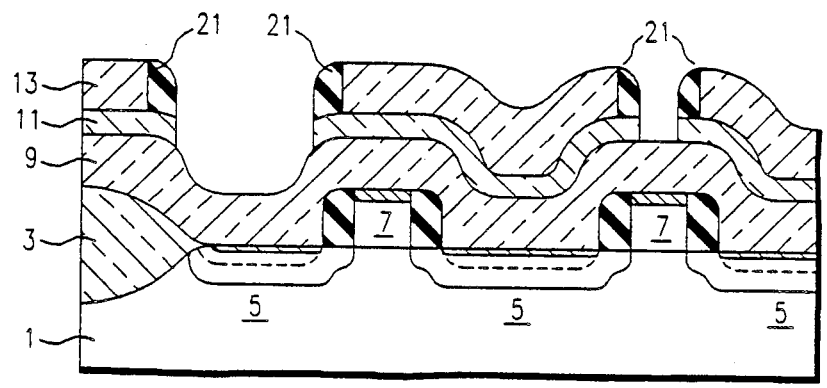

Oxide layer 19 is now etched back to produce the structure depicted in FIG. 3. Nitride layer 15 acts as an etch step layer; i.e., layers 15 and 19 have a high etch selectivity with respect to each other. As can be seen, the deposition and etchback steps produce a plurality of oxide sidewall spacers 21 and expose selected portions of the underlying nitride layer 11. The BPTEOS layers and sidewall spacers are now used as an etch mask for conventional and well known etch techniques which remove the exposed portions of the thin nitride layer 11, e.g., the first nitride layer. It does not matter that the remaining portion of layer 15 is also removed. The resulting structure is depicted in FIG. 4.

Figure 5:
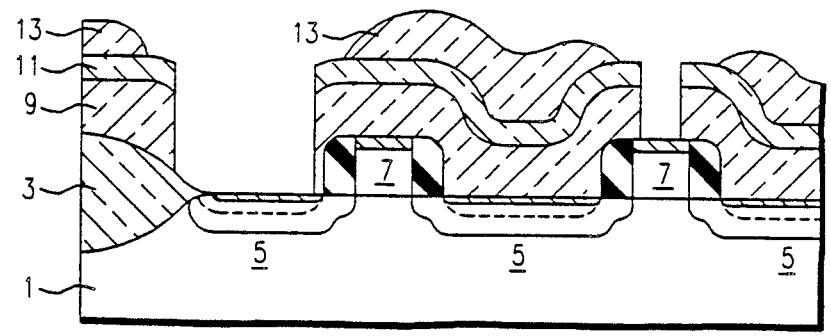

Conventional etching techniques are used to remove the exposed portions of the first insulating layer 9, e.g., first oxide layer. Nitride layer 11 acts as a mask for this etching step. Portions of the source/drain region of a first transistor and of the gate structure of a second transistor are now exposed. As will be appreciated by those skilled in the art, at least portions of the second oxide; i.e., BPTEOS, layer and of the BPTEOS oxide sidewall spacers are removed by this etching step. The resulting structure is depicted in FIG. 5. An additional implantation step may be performed, if necessary, to prevent electrical shorts.

Figure 6:
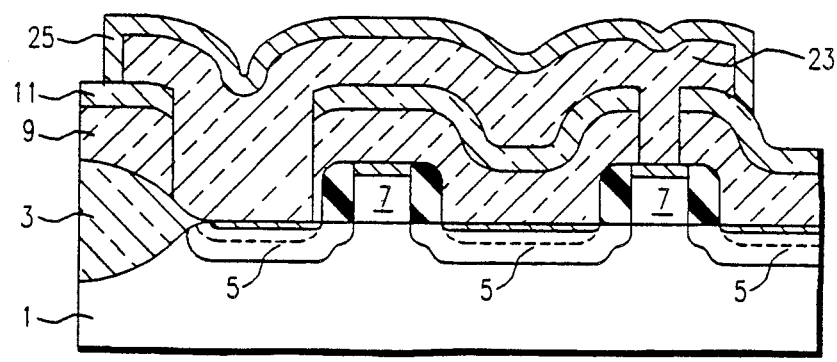

The oxide of layer 13 that remains above the first nitride layer in FIG. 5 is removed by, e.g., a wet etch, and a layer 23 is deposited and patterned. Layer 23 comprises a conductor such as polysilicon. The wet etch should have a high selectivity with respect to the oxide of layer 9 so that there is no undercutting of the sidewalls of the window. Layer 23 will form the contacts to the device regions and between the devices. As shown, layer 23 runs between the source/drain region of a first transistor and the gate structure of a second transistor. If desired, conductivity increasing steps, such as silicidation, may also be performed. As depicted, layer 23 has a silicide region 25 on top. Silicidation may be complete; i.e., it may consume all of the polysilicon. The resulting structure is depicted in FIG. 6.

The structure depicted has at least several desirable features. For example, the windows to both the source/drain region and to the gate structure are smaller than the windows printed in the resist. The actual window size is thus smaller than is the printed size and may be smaller than the lithographic limit. Additionally, the layer that passes over the gate structure, without contacting it, and is well isolated electrically from the gate by both layers 5 and 11.

Those skilled in the art will readily appreciate that the structure depicted can be used in an SRAM and that the silicide has low contact resistance. The structure depicted has still other advantages over typical prior art structures. For example, the gate contact and the drain region can be relatively close to each other because the first and second insulating layers, as well as the insulating sidewalls on the gate structure, increase the tolerance for registration errors. Additionally, if a salicide (self-aligned silicide) process is used, the gate structure and the source/drain regions can be salicided at the same time.

Variations of the process described are contemplated. For example, it will be readily understood that, although layers 5, 7, 9, and 11 are described in terms of oxide and nitride compositions, it is only important that they have etch rate differentials, i.e., adjacent layers having different etching characteristics, and that other compositions can be used. It will also be apparent to those skilled in the art that oxides having etch rate differentials with respect to each other can be considered as having different compositions, even though they may have nominally identical stoichiometries. The compositional differences are due to structural differences.

I claim:

1. A method of integrated circuit manufacture comprising the steps of making a plurality of field-effect transistors, each comprising source and drain regions and a gate structure, and being disposed on a common substrate and making an electrical contact to at least said gate structure of at least one of said field effect transistors, said step of making an electrical contact comprising the further steps of forming first, second, third, and fourth insulating layers having first, second, third, and fourth compositions, respectively, over said plurality of said field-effect transistors, adjacent layers having different etching characteristics;

patterning a resist over said fourth layer to expose selected portions of said fourth layer, at least one of said portions being generally over at least said gate structure of a first transistor;

etching said exposed portions of said fourth and third layers to form windows which expose portions of said second layer;

forming sidewalls on said windows;

etching said exposed portions of said second and first layers using said sidewalls and said second layer, respectively, as etch masks to expose at least said gate structure; and, forming a patterned conductor region contacting at least gate structure of said first transistor.

2. A method as recited in claim 1 in which said conductor comprises polysilicon.

3. A method as recited in claim 2 comprising the further step of siliciding said polysilicon.

4. A method as recited in claim 1 in which said step of forming sidewalls comprises the steps of depositing a fifth insulating layer having a fifth composition and etching back to expose portions of said fourth layer.

5. A method as recited in claim 4 in which at least one of said windows is generally over a source/drain region of a second transistor.

6. A method as recited in claim 5 in which said patterned conductor contacts said source/drain region of said second transistor thereby electrically connecting said first and said second transistors.

7. A method as recited in claim 1 in which said first and third layers comprise silicon oxides.

8. A method as recited in claim 7 in which said third and fourth layers comprise a silicon nitride.

9. A method as recited in claim 8 in which said fifth composition comprises a silicon oxide.

* * * * *